United States Patent [19]

Van De Velde et al.

[11] Patent Number: 5,341,814
[45] Date of Patent: Aug. 30, 1994

[54] METHOD FOR MEASURING THE TEMPERATURE OF A MATERIAL BY USING MICROWAVE RADIATION

[75] Inventors: Jean-Claude Van De Velde, Mons-En-Baroeul; Eugéne Constant, Villeneuve D'Ascq, both of France

[73] Assignee: Centre Natinal De La Recherche Scientifique, Paris, France

[21] Appl. No.: 930,425
[22] PCT Filed: Jan. 29, 1992
[86] PCT No.: PCT/FR92/00080
§ 371 Date: Nov. 12, 1992
§ 102(e) Date: Nov. 12, 1992
[87] PCT Pub. No.: WO92/14164
PCT Pub. Date: Aug. 20, 1992

[30] Foreign Application Priority Data

Feb. 1, 1991 [FR] France ................. 1-344

[51] Int. Cl.⁵ .................. G01J 5/10; A61B 10/00
[52] U.S. Cl. ........................................ 128/736
[58] Field of Search ............... 128/736, 785, 804; 455/315; 607/156, 154

[56] References Cited

U.S. PATENT DOCUMENTS

| | | | |
|---|---|---|---|
| 4,346,716 | 8/1982 | Carr | 128/736 |
| 4,491,976 | 1/1985 | Saitoh et al. | 455/315 |
| 4,627,442 | 12/1986 | Land | 128/736 |
| 4,677,988 | 7/1987 | Constant et al. | 128/736 |
| 5,220,927 | 6/1993 | Astrahan et al. | 128/736 |

FOREIGN PATENT DOCUMENTS

| | | | |
|---|---|---|---|
| 0159279 | 10/1985 | European Pat. Off. | 128/736 |
| 0294854 | 12/1988 | European Pat. Off. | 128/736 |
| 2497947 | 7/1981 | France | 128/736 |
| 2561769 | 9/1985 | France | 128/736 |
| 2650390 | 2/1991 | France | 128/736 |

OTHER PUBLICATIONS

D. Vanloot et al., *L'onde Electrique,* "New Low Frequency Electronic Circuit for Signal Processing Designed for Medical Radiometers", vol. 69, No. 5, Sep.-/Oct. 1989, pp. 60–65.

I. M. Angelov et al., *Conference Proceedings, 19th European Microwave Conference,* "Radiometer for Microwave Thermography", London, 4–7 Sep. 1989, Microwave Exhibitions an Publishers Ltd., pp. 924–929.

Y. Kato et al., *IEEE Transactions on Microwave Theory and Techniques,* "A Method for Evaluating the Noise Sources by Introducing an Auxillary Transmission Line", vol. 36, No. 1, Jan. 1988, pp. 145–147.

English and French copies of the International Search Report and Annex.

*Primary Examiner*—William E. Kamm
*Assistant Examiner*—George Manuel
*Attorney, Agent, or Firm*—Sandler, Greenblum & Bernstein

[57] ABSTRACT

The invention relates to a method and a device for measuring the temperature $T_x$ of any material or object, by using a microwave radiation, as well as to an application of said method for determining the coefficient of hyperfrequency reflection of any material or object. According to the method, the microwave radiation emitted through an antenna (1) is captured and the signals received are directed towards signal processing means (3). Additionally, between the antenna (1) and said means (3), a given impedance line (4) is intercalated whose impedance is a function of the input impedance of said means (3), and with a length L much bigger than the wave length of processed signals, so that the correlation factor of said means (3) is negligible. Furthermore, the output voltage is processed by calculation of all parameters by cylindrically modifying the structure of said processing means (3).

20 Claims, 3 Drawing Sheets

METHOD FOR MEASURING THE TEMPERATURE OF A MATERIAL BY USING MICROWAVE RADIATION

BACKGROUND OF THE INVENTION

1. Field of the Invention

The invention relates to the determination of the temperature of a given material or object, as well as of its microwave frequency reflection coefficient.

To determine the temperature of an object, it is known in the art to use measuring processes whereby the thermal noise signals emitted by this object in the microwave frequency range are picked up and a correspondence is established between strength of the signals picked up and the temperature of the object.

In this connection, the term "object" is to be taken in a very broad sense as it can refer equally well to a material object or to a material, or even to living tissues. Any absorbent body in fact emits thermal noise signals directly related to its temperature. Such thermal noise signals are emitted over a very wide frequency range.

2. Description of Background Information

To carry out temperature measurements, there are also known other processes using signals emitted in the infrared range. However, the drawback is that the signal picked up are emitted primarily by the surface of the body to be measured and the surface temperature cannot then be measured.

Another known measuring method consists in using a thermocouple, which is necessarily introduced inside the body the temperature of which one wishes to measure. However, in very many cases, the penetration of the body by the thermocouple represents a major drawback.

To avoid such drawbacks, it is preferred to make use of the thermal noise signals emitted in the microwave frequency range, that is to say frequencies ranging approximately between 0.5 and 20 GHz.

In this connection, there are known microwave radiometry devices in which the microwave radiation emitted via an antenna is picked up and the signals received are routed to signal processing means which enable the temperature of the object in question to be determined.

However, on of the main problems encountered in microwave frequency radiometry resides in the matching of the antenna in respect of the material the temperature of which one wishes to know. Indeed, the antenna used has a reflection coefficient $R_o$ and, as a result, the antenna is never perfectly matched, given that the objects to be measured generally have different configurations, sizes and properties.

Under these circumstances, the error made in measuring the temperature of the object, due to the fact that the coefficient $|R_o|^2$ of the antenna is different from zero, has two implications, namely: on one hand, the emissivity of the object: $=1-|R_o|^2$ is different from unity and, on the other hand, given the reflection coefficient of the antenna, a part of the noise emitted at the input of the signal processing means is reflected by the antenna, and then amplified by the said means, and thus unduly contributes to the signal measured at the output of the said means.

To remedy these different drawbacks, different processes have been devised to enable the internal temperature of a body to be measured without thereby necessitating the introduction into this body of means to detect this temperature.

Document FR-2,497,947, in fact, discloses a microwave thermography device and process based on the principle of the Dicke radiometer, using an antenna, a circulator, an auxiliary source of noise with known characteristics, an amplifier-receiver and a detector. In addition, according to this document, the use of a circulator is associated with a two-channel microwave frequency switch cyclically connecting the measuring line to the antenna or short circuiting the measuring line.

Thus, this circulator-switch assembly, on one hand, enables the signal emitted at the input of the amplifier to be absorbed and, on the other hand, enables the antenna to be presented with a temperature load substantially equal to that of the material to be measured. Under these conditions, when the coefficient $|R_o|^2$ is different from zero, the reduction in noise emitted by the material to be measured is compensated for by the noise emitted by the said load and reflected by the antenna.

However, the process and device according to document FR-2,497,947 necessitate the use of a circulator, which can be disadvantageous in certain cases. The circulator is, in fact, generally formed by a ferrite element determined in accordance with the frequency range and over the size and price of which one has no control. This naturally affects, therefore, the cost of the device and on its size, precluding any possibility of monolithically integrating the device.

This being the case, document FR-2,561,769 discloses a process for controlling impedance matching in low noise reception chains and a miniature microwave thermometer for implementing this process.

Such a device comprises an antenna, a temperature and impedance adjustable standard noise source, switching means connected to the antenna and to the standard noise source, an amplifier disposed downstream of the switch, supplying a signal the amplitude of which corresponds to the difference in level between the signals from the antenna and the standard noise source, a controlled additional impedance to be placed periodically at the amplifier input, and means for analyzing the divergence between the impedances presented by the antenna and the standard noise source, to adjust, by matching their impedances, either the antenna or the noise source, to equalize the influences exerted by the additional impedance on the antenna and on the noise source, and, in consequence, to equalize the impedances presented by the antenna and the standard noise source.

The process according to FR-2,561,769 thus consists in attempting to use a reference noise source, the electronically adjustable reflection coefficient of which is made equal in modulus to that of the antenna placed in the presence of the object to be measured. For this purpose, the noise emitted by the amplifier input can be used to check the equality of the two reflection coefficients, and use is made, for this purpose, of a variable additional impedance the value of which can be electronically controlled, and which is placed at the input of the amplifier.

Such a technique makes it possible to dispense with the use of a circulator; unfortunately, however, it can only be used when the load presented by the antenna is resistive and if the length of line placed between the antenna and the amplifier is negligible.

To the disadvantages of the known devices should be added other limitations for which it is not possible to find solutions. In particular, when a circulator is used, the size of the ferrite utilized is all the greater the lower the frequency at which one operates. For example, at 1 GHz, the size soon becomes prohibitive. Furthermore, when operating to determine the temperature with a zero method, one generally attempts to make nil a factor constituted by the difference between the temperature of the auxiliary reference source and the temperature of the body to be measured. It thus becomes a delicate matter to measure the temperature of a body with a temperature of less than 273° K. (°C.), which is disadvantageous in certain cases.

Furthermore, in a measuring chain, the removal of the circulator element is not problem-free. Indeed, for an amplifier having a given gain g, the latter inevitably presents an input noise $T_e$, as well as an amplifier noise $T_a$, charactering its noise factor. Thus, in direct amplification circuits, allowances have to be made for a possible correlation between input noise $T_e$ and the output noise of the amplifier, $T_a$ when the load at the circuit input is not matched.

The measurement errors due to the mismatch depend on the refection coefficient $R_o$, and on the said noises $T_e$ and $T_a$.

To remedy this correlation phenomenon, it is known in the art to use in parallel on the amplifier input line aperiodic phase shifters, which make it possible to introduce randomly phases $-\pi/2$, $+\pi/2$, for example, the purpose of which is to preclude any possibility of coherent construction of the noises, and thus to cancel out any correlation between Te and $T_a$.

However, such phase shifters reduce the amplitude of the noise signals picked up and are, furthermore, of large dimensions, which render any monolithic integration of the radiometer impossible.

SUMMARY OF THE INVENTION

The object of the present invention is to provide a process and a device for measuring the temperature of a material or of a given object using microwave radiation, which enable the aforementioned drawbacks to be overcome and make it possible to dispense with the use of a circulator while, at the same time, permitting precise temperature measurement.

One of the objects of the present invention is to provide a process and a device for measuring radiometric signals which can, consequently, be designed using monolithic integration techniques and are thus miniaturizable and of low cost.

Another object of the present invention is to provide a process for measuring radiometric signals which can be used when the antenna is not especially matched to the object to be measured, or if the length of line placed between the antenna and the amplifier is not negligible.

Another object of the present invention is to provide a process and a device for measuring radiometric signals which make it possible to become free from the influence of any correlation between the input noise and the output noise of the amplifier when the load at the input is not matched.

Another object of the present invention is to provide a process for measuring radiometric signals which does not use the principle of the Dicke radiometer, while producing a result that is equivalent, or even superior.

Another object of the invention concerns, in fact, the application of the radiometric signal measuring process to determining the microwave frequency reflection coefficient of a material or a given object.

Further objects and advantages of the present invention will emerge in the course of the following description which is, however, given only by way of illustration and is not intended to limit it.

According to the invention, the process for measuring the temperature $T_x$ of a given material or object using microwave radiation, whereby the microwave radiation emitted via an antenna, having a reflection coefficient, $R_{o\,x}$, is picked up, and the signals received are routed to signal processing means, is characterized by the fact that there is intercalated between the antenna and the said means a line of a given impedance, which is a function of the input impedance of the said means, having a length L that is very large in relation to the wavelength of the signals such that the correlation factor of the said means is negligible.

Furthermore, according to the measuring process of the invention, the signals received by the antenna are routed, via the said length L of line, to the input of the said processing means, with a power gain $\tau g$, with an input noise temperature $T_e$ and an output noise temperature $T_a$ such that the following output voltage is obtained at the output of the said processing means:

$$V_s = g\gamma[T_x(1-|R_{o\,x}|^2) + T_e|R_{o\,x}|^2 + T_a]$$

then all the parameters are calculated periodically by modifying cyclically the structure of the said means.

In this respect, to implement the process according to the invention, the measuring device has an intercalary line of a length L, with a given impedance that is a function of the input impedance of the signal processing means, placed between the latter and the antenna, the said length L being very large in relation to the wavelength of the signals processed.

Furthermore, the said processing means ape constituted by a direct amplification microwave frequency receiver, followed by a square law detector, and preceded by a microwave frequency multi-way switch, suitable for modifying the structure of the said means cyclically.

BRIEF DESCRIPTION OF THE DRAWINGS

The present invention will be more readily understood from the following description which is given, however, only by way of illustration and is not intended to limit it, accompanied by the drawings, which form an integral part thereof, wherein.

DESCRIPTION OF THE PREFERRED EMBODIMENTS

Figure 1:
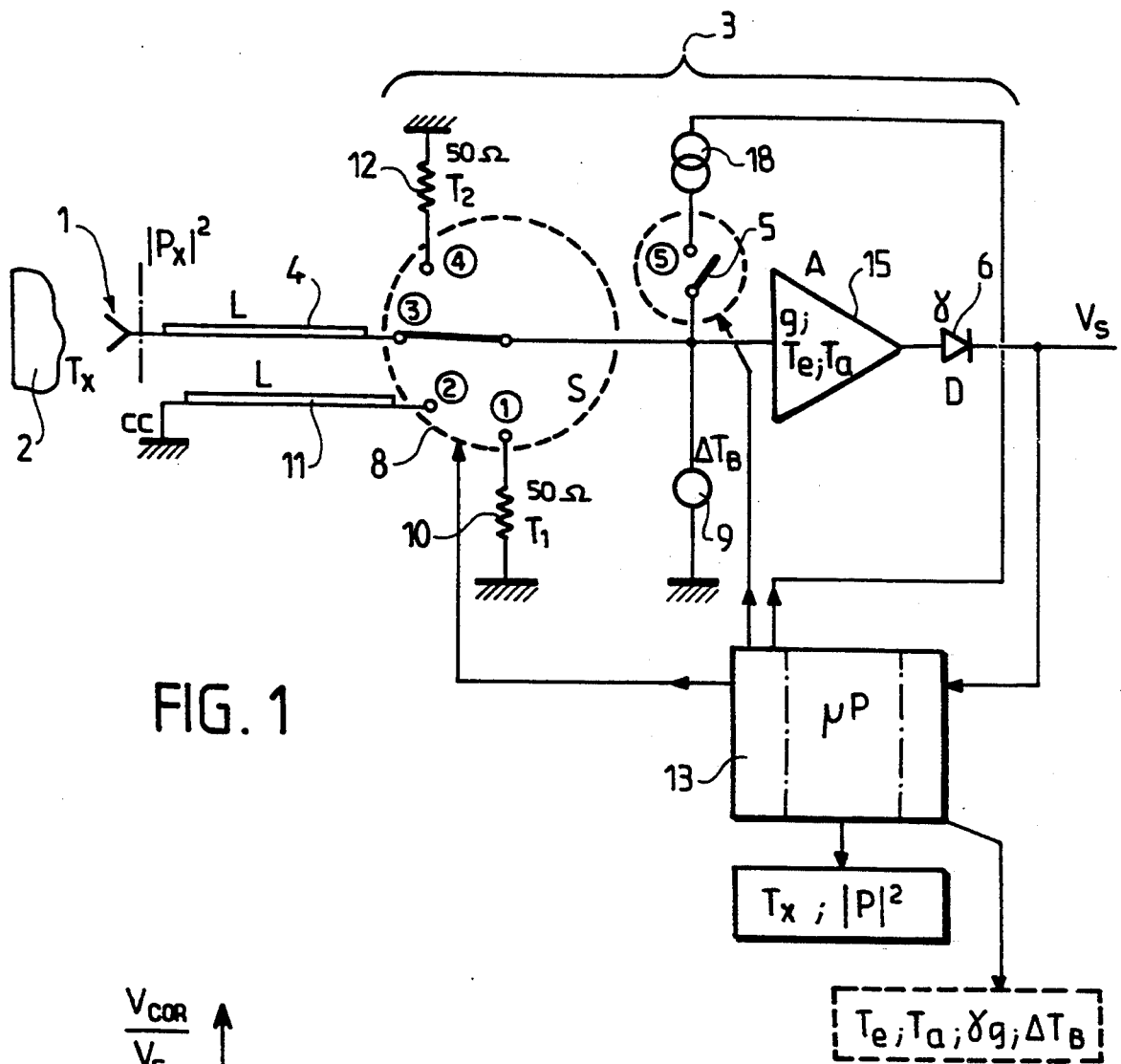
FIG. 1 is a functional diagram of the device for measuring the temperature and/or determining the microwave frequency reflection coefficient of a given material or object.

The invention relates to a process and a device for measuring the temperature of a given material or object, using microwave radiation, as well as to an application of the measuring process for the purpose of determining the microwave frequency reflection coefficient of a given material or object.

As mentioned earlier, the term "object" or "material" is to be interpreted broadly, to refer to the material of a body to be measured, a body which can, in particular, be material objects, substances or living tissues.

Furthermore, it should also be pointed out that any material brought to a temperature $T_x$, emits electromagnetic radiation the power of which, in the microwave range, is proportional to the temperature and to the pass-band of the measuring device. In particular, the power picked up by an antenna is given by the relation:

$$P = kT_x \Delta f(1 - |R_{o\,x}|^2)$$

wherein k is the Boltzmann's constant ($1.38.10^{-23}$), $T_x$ the temperature of the material to be measured, $\Delta f$ the pass-band, and $|R_{o\,x}|^2$ the reflection coefficient of the antenna.

When a direct amplification radiometer is produced, that is to say when an antenna is connected directly to the input of an amplifier-receiver A, and a square law detector D is connected to its output, without intercalating the circulator chain, the voltage $V_s$ at the output of the detector is given by the following relation:

$$V_s = g\gamma[T_x(1 - |R_{o\,x}|^2) + T_e|R_{o\,x}|^2 + T_a]$$

wherein g corresponds to the gain of the amplifier, $\tau$ corresponds to the conversion gain of the detector, $T_e$ corresponds to the input noise of the amplifier and $T_a$ corresponds to the noise of the amplifier, characterizing its noise factor.

However, this relation $V_s$ has to be corrected for the radiometric measurement error caused by a possible correlation between the input noise $T_e$ and the output noise $T_a$ of the amplifier when the load at the input of the radiometer is not matched.

The noise $T_e$ is linked to the physical temperature of the amplifier and the noise $T_a$ is linked to the image of the degradation brought by the amplifier to the input noise. There is said to be correlation between $T_e$ and $T_a$.

Thus, when a circulator is not used, the basic contribution, at a frequency f, of the correlation noise induced by the amplifier, is given by the following relation:

$$dS_{cor} = k\,[|R_{o\,x}|^2\,T_e + T_a + 2\sqrt{|R_{o\,x}|^2\,T_e T_a}\cdot\cos\phi]\,df$$

wherein:
k is the Boltzmann's constant,
$\Phi$ is the phase difference between the input noise and the output noise of the receiver equal to $2\pi.L_o.f/c$.,
C is the speed of light,
$L_o$ corresponds to the intrinsic length of the amplifier.

The total contribution of the correlation noise is thus obtained by integrating the preceding equation in the passband of the amplifier, which gives:

$$S_{cor} = k\cdot[|R_{o\,x}|^2 T_e + T_a +$$

$$2\sqrt{|R_{c\,x}|^2\,T_e T_a}\;\frac{\sin(\alpha/2\cdot(f_2 - f_1))}{\alpha/2\cdot(f_2 - f_1)}\cdot\cos(\alpha/2\cdot(f_2 + f_1))]\,\Delta f$$

with $$\alpha = \frac{2\pi\,(2L + L_o)}{C}$$

$f_2$ and $f_1$ being respectively the high and low cut-off frequencies of the amplifier,
$\Delta f$ being the pass-band of the amplifier, $f_2 - f_1$,
L being the length of the line between the input of the amplifier and the antenna.

As a function of the above, one of the characteristics of the present invention resides in the fact that there is intercalated between the antenna and the said signal processing means, in particular its amplifier, a line of given impedance, which is a function of the input impedance of the amplifier, having a length L which is very large in relation to the wavelength of the signals such that the correlation noise factor of the said means is negligible.

In the preceding equation, $S_{cor}$, the following quantity will thus be obtained:

$$2\sqrt{|R_{o\,x}|^2\,T_e T_a}\;\frac{\sin(\alpha/2\cdot(f_2 - f_1))}{\alpha/2\cdot(f_2 - f_1)}\cdot\cos(\alpha/2\cdot(f_2 + f_1))$$

which tends towards zero, when $\alpha$ tends towards infinity. This condition is fulfilled when L is very large in relation to the wavelength of the signals processed, namely $C/f_2-f_1$.

Figure 2:
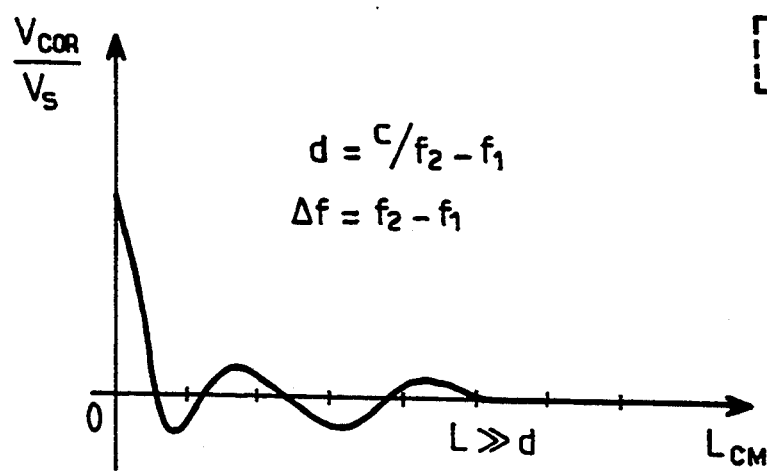
FIG. 2 represents in graph form the value of the correlation factor expression, for a determined amplifier pass-band, as a function of the length of the line L between the antenna and the amplifier input.

The graph in FIG. 2 illustrates the influence of the correlation and, more precisely, the ratio $V_{cor}/V_s$ as a function of the length L in centimeters between the antenna and the amplifier input.

The ratio can be seen to tend towards zero when L is very large in relation to the wavelength. For example, in the case of an amplifier operating in a pass-band of 2 to 4 GHz, we begin to obtain results as from a length L in the order of 10 cm. For the sake of security, use will be made of a length of 40 cm, for example.

Furthermore, the impedance of this line L has to correspond substantially to the input impedance of the amplifier to avoid a mismatch. In the microwave frequency, the amplifiers used generally have an input impedance in the order of 50 ohms, which is why a line section L will be chosen to conduct energy from the antenna to the amplifier with a characteristic impedance Zc of 50 ohms.

This being the case, it can then be considered that the radiometric signal is given by the relation indicated previously, namely:

$$V_s = g\gamma[T_x(1-|R_{o\,x}|^2) + T_e|R_{o\,x}|^2 + T_a]$$

Thus, according to another feature of the measuring process according to the present invention, the signals received by the antenna are routed, via the said length of line L, to the input of the processing means such that the said voltage $V_s$ is obtained at the output, and all the parameters are then calculated periodically by cyclically modifying the structure of the said means.

FIG. 1 diagrammatically illustrates, by way of example, a device for measuring the temperature $T_x$ of given a material or object permitting implementation of the process according to the invention.

This diagram shows an antenna 1 for receiving signals emitted by the object 2, the temperature $T_x$ of which it is wished to determine, connected to processing means 3 via an intercalary line 4 having a length L such as defined above.

More precisely, the processing means 3 are constituted by a direct amplification microwave frequency receiver 15, followed by a square law detector 6 and preceded by a microwave frequency multi-channel switch 8.

As we have already seen, the microwave frequency receiver 15 can also be constituted by an amplifier A, with a microwave frequency pass-band, a large gain g, and a low noise factor.

Furthermore, given the absence of the traditional amplifier, this amplifier can be produced using integrated monolithic technology.

As to square law detector 8, with a conversion gain $\tau$, it will be formed advantageously by a Schottky detection diode, which is also easy to integrate.

This being the case, according to the present invention, to determine the value of temperature $T_x$, the equation to be solved will be:

$$V_s = g\gamma[T_x(1-|R_{o\,x}|^2) + T_e|T_{o\,x}|^2 + R_a]$$

wherein the parameters to be determined are $g\tau$, $T_e$, $T_a$, $|R_{o\,x}|^2$, and $T_x$.

We thus have an equation with five unknowns, and, with the process according to the invention, the structure of the signal processing means will thus be modified cyclically as many times as necessary to obtain as many equations as there are unknowns.

However, in order to facilitate this solution, according to the process of the invention, the said processing means are further subjected selectively and cyclically to the influence of a high impedance ($Z>>Zc$) noise source $\Delta T_B$ to avoid disturbing the measuring line, which changes the relationship giving the output voltage $V_s$ as follows:

$$V_s = g\gamma[T_x(1-|R_{o\,x}|^2) + T_e|R_{o\,x}|^2 + T_a + \Delta T_B(1+|R_{o\,x}|^2)]$$

The device according to the present invention, and, more precisely, the said processing means 3, further comprise, as shown in FIG. 1, a noise source 9, suitable for reinjecting complementary noise $\Delta T_B$, placed at the input to the said means, and, more precisely, at the input to amplifier 5.

This noise source is an advantageous element which will make it easier to solve the system of equations.

In this connection, the said switch 8 will have, advantageously, at least four microwave frequency channels which, as illustrated in FIG. 1, are connected to:

a load 10, of known characteristics, having a temperature $T_1$, a line of a length L, similar to intermediate line 4, this line being short-circuited, the said intermediate line 4, of a length L, connected to antenna 1, another load 12, of known characteristics, having a temperature $T_2$, the said noise source 9$\Delta T_B$.

The four different channels of the switch are identified on the figure by a serial number, 1, 2, 3 and 4, surrounded by a circle; circled round serial number 5 corresponds to a control 5, in particular a logic control, activating or otherwise the said source $\Delta T_B$.

Furthermore, in order to command cyclically the said microwave frequency switch 8 and the said control 5, the device according to the present invention comprises a computing and synchronising unit 13, in order to permit, in cooperation with the said switch 8 and the said control 5, the mathematical real-time solution of a system of equations defined for each condition of the switch, with a view to determining at least the temperature $T_x$ of the body to be measured.

More precisely, according to the measuring process of the present invention, the input of the said processing means, or more precisely the input of amplifier receiver 15, is connected cyclically to:

the load 10 having a temperature $T_1$, using the switch on channel 1, the said load 10 having a temperature $T_1$ and the noise source 9, $\Delta T_B$, using the switch on channel 1 and supplying the said source $\Delta T_B$ via control 5, ground via line 11, by placing the switch on channel 2, antenna 1 via line 4 L, by placing the switch on position 3, the said antenna 1 via the said line 4 and the said complementary noise source 9, by placing the switch on channel 3 and supplying the said source $\Delta T_B$ via control 5, load 12 having a temperature $T_2$ by placing the switch on channel 4.

Thus, at each cycle, we obtain the following system of equations:

$$V_1 = \gamma g[T_1 + T_a]$$

$$V_{15} = \gamma g[T_1 + T_a + \Delta T_B]$$

$$V_2 = \gamma g[T_e + T_a]$$

$$V_3 = \gamma g[(1-|R_o x|^2)T_x + |R_o x|^2 T_e + T_a]$$

$$V_{35} = \gamma g[(1-|R_o x|^2)T_x + |R_o x|^2 T_e + T_a + (1+|R_o x|^2 \Delta T_B]$$

$$V_4 = \gamma g[T_2 + T_a]$$

Such a system, with six equations and six unkowns, can be processed using conventional computing means, such as computing unit 13 organized around a microprocessor, an analog input and output interface board (analog digital/digital analog converter), a logic input and output board (PIA) and display means.

Unit 13 will thus enable the six parameters to be determined and, in particular, the display of the temperature values $T_x$ and of the antenna reflection coefficient $|R_o|^2$. Furthermore, if required, the parameters specific to the amplifier, $\tau g$, $T_e$ and $T_a$, $\Delta T_B$, can be displayed.

To conclude, the different parameters will be obtained from the following equations:

$$g\delta = \frac{V_1 - V_4}{T_1 - T_2}$$

$$\Delta T_B = \frac{V_{15} - V_1}{V_1 - V_4}(T_1 - T_2)$$

$$|R_o x|^2 = \frac{V_{35} - V_3}{V_{15} - V_1} - 1$$

$$T_a = \frac{R_1 V_4 - T_2 V_1}{V_1 - V_4}$$

$$T_e = \frac{V_2(T_1 - T_2) - T_1 V_4 + T_2 V_1}{V_1 - V_4}$$

$$T_x = T_1 + \frac{(T_1 - T_2)}{(V_4 - V_1)(1 - |R_o x|^2)}[(V_3 - V_1) - |R_o x|^2(V_2 - V_1)]$$

This computing and synchronising unit is managed by a loop program comprising:
 initialization of the logic board,
 operation of the four channels of the microwave frequency switch and acquisition of the radiometric signals averaged over "n" samples, for example n=100,
 control 5 activating or not activating the said noise source $\Delta T_B$,
 computing parameters $T_x$, $|R_o x|^2$, $T_e$, $T_a$, $\tau g$, $\Delta T_B$,
 averaging the parameters over "n" values,
 displaying the results,
 return to initialization.

As to the structure of loads 10 and 12, use will be made advantageously of the loads the impedance of which is matched to that of the amplifier input and thus, in the present case, loads having an impedance of 50 ohms which will each be placed at a pre-established, known temperature, $T_1$ and/or $T_2$.

As to microwave frequency switch 8, use will made advantageously of an assembly of four-channel MES FET elements.

Figure 3:
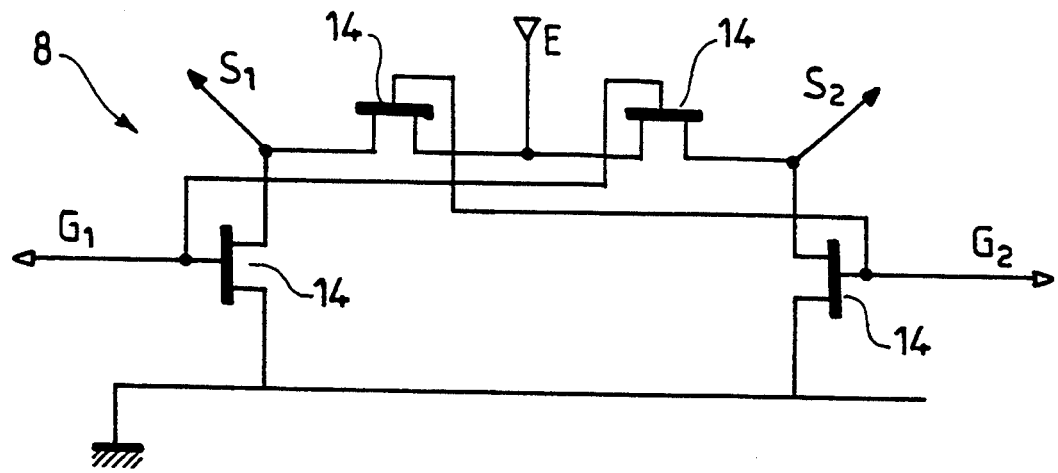
FIG. 3 diagrammatically represents the structural design of a two-channel switch.

By way of example, FIG. 3 shows such an arrangement of MES FET elements to form a high insulation two-channel microwave frequency switch.

We thus have four MES FET elements 14 disposed in series, the gates of which are controlled two by two respectively at $G_1$ and $G_2$ from computing and synchronising unit 13.

Between points $ES_1$ and $ES_2$, we then have the two desired channels, E being the common point of the switch.

Such a technique is within the reach of one skilled in the art in question and will be extended to the production of a four channel switch.

Figure 4:
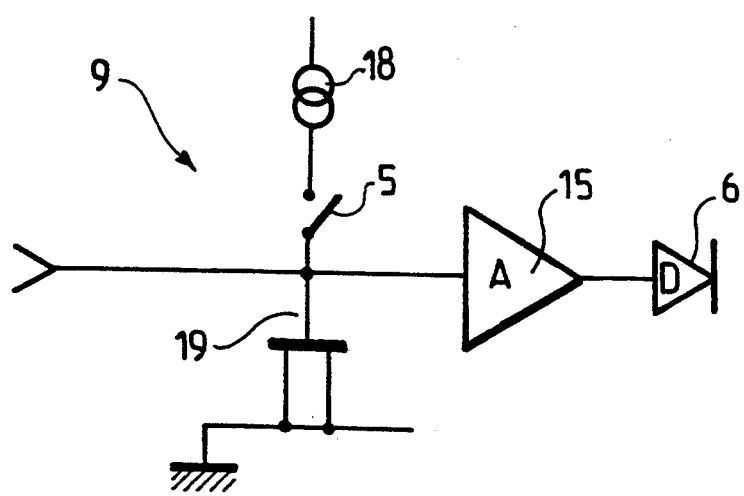
FIG. 4 represents a first form of embodiment of a source of high impedance noise introduced into the said means according to the present invention.
Figure 5:
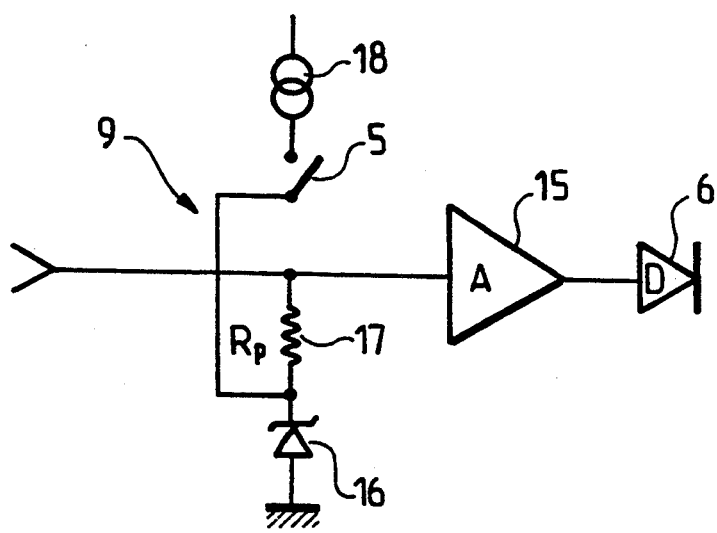
FIG. 5 represents another form of embodiment of a source of high impedance noise introduced into the said means according to the present invention.

Finally, FIGS. 4 and 5 represent two forms of embodiment that can be contemplated for noise source 9.

FIG. 4 shows such a complementary noise source 9 formed by a MES FET element 19 of which the Schottky contact is used reverse biased until avalanche conditions are obtained. The avalanche noise thus obtained is controlled by a current generator 18.

On the other hand, FIG. 5 shows the use of an avalanche diode 16 placed in series with a resistor $R_p$ having a large ohmic value in relation to the input impedance of the said means, arranged at the input of the latter.

This circuitry is also within the reach of a man of the art. However, the essential criterion to be kept in mind is to produce a source of noise with high impedance in relation to that of the amplifier input, to avoid mismatching the circuit.

As to the antenna, use will be made of any device suitable for picking up microwave frequency radiation, such as any measuring cell, applicator or dipole.

Figure 6:
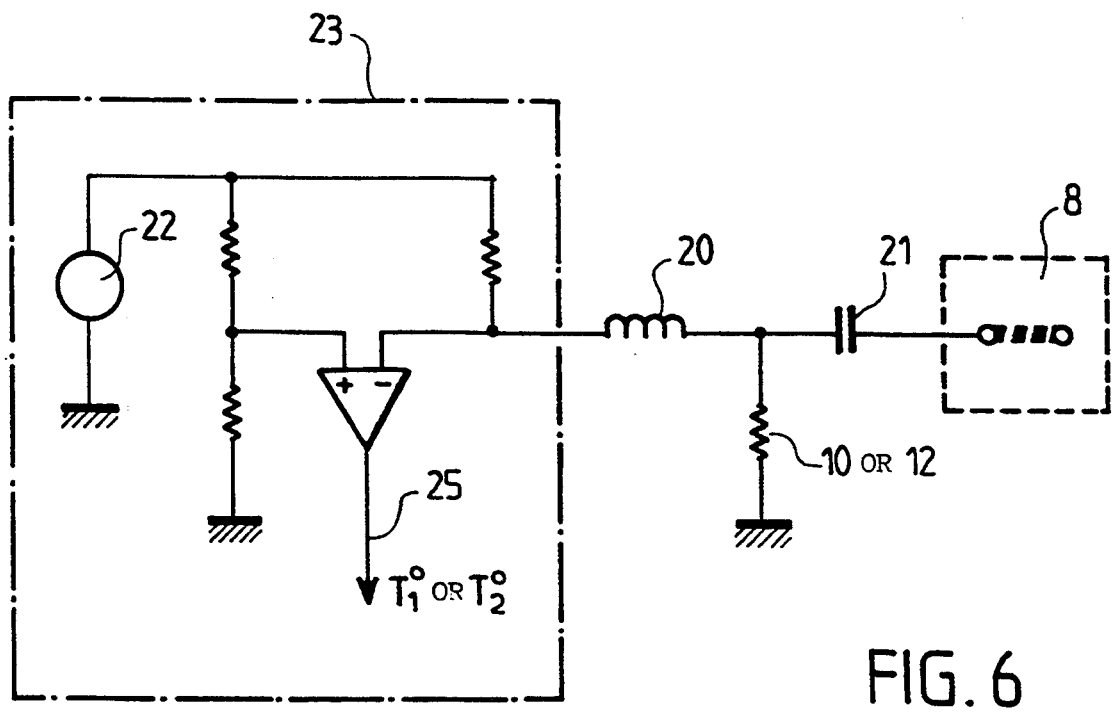
FIG. 6 diagrammatically represents a form of embodiment of a circuit for measuring the temperature of a reference load.
Figure 7:
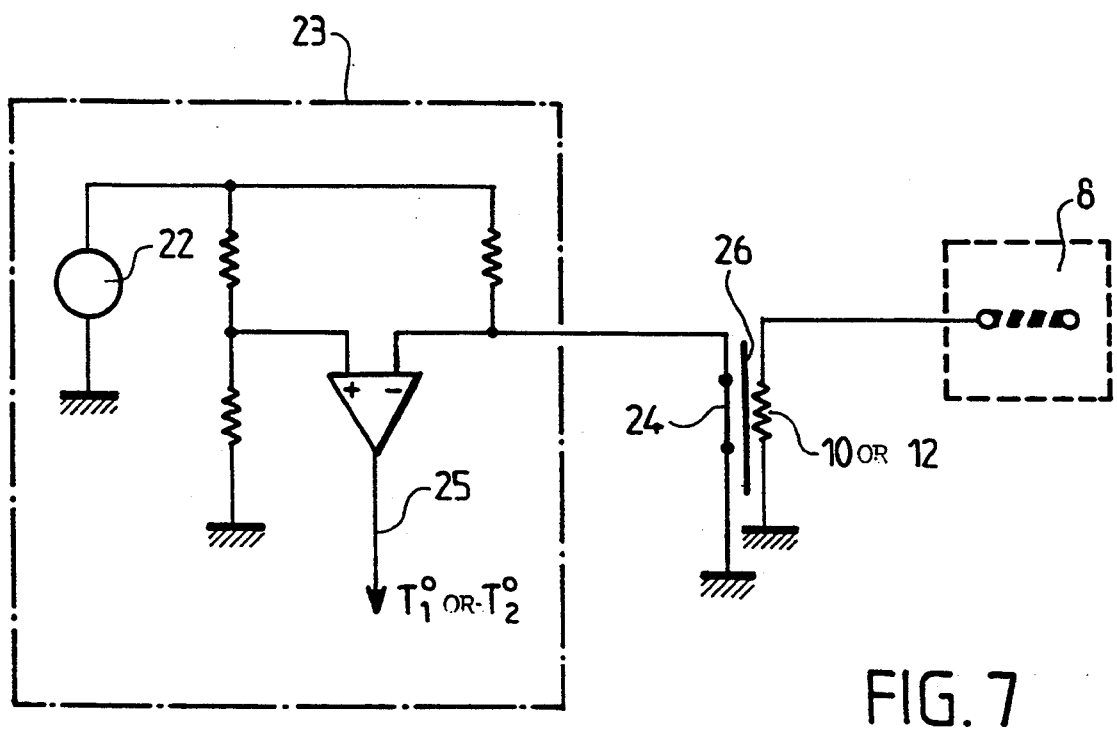
FIG. 7 diagrammatically represents another form of embodiment of a circuit for measuring the temperature of a reference load.

To determine the temperature values $T_1$ or $T_2$ of loads 10 or 12, use can be made of various methods, such as those illustrated in FIGS. 6 and 7.

In FIG. 6, AsGa planar resistors, constituting loads 10, 12, having a known temperature coefficient, are introduced into a Wheatstone bridge 23, which is, for example, supplied by a d.c. or a.c. generator 22 and outputs at 25 a signal proportional to temperature $T_1$ or $T_2$, via an inductance-capacitance polarizing Tee, 20, 21.

In FIG. 7, a resistive film 24 of nickel-chromium (NiCr) or tantalum nitride (NiTa), having a known temperature coefficient, is deposited on the AsGa planar resistors constituting loads 10, 12, previously insulated by a polymide element 26. These NiCr or NiTa resistors 24 are introduced into a measuring bridge, such as a Wheatstone bridge 23, for example, as described earlier.

This being the case, the reasoning which has just been set out starts out from the principle that the microwave frequency switch 8 is loss-free. However, such a switch inevitably has a certain resistance, characterized by "a", which is an image of the transmission of one of the channels of the switch.

Thus, a part of the thermal noise power will be attenuated by the switch and we can consider that the switch used is equivalent to an attenuator brought to a temperature $T_{com}$. Thus, the general relation for output voltage $V_s$ is written as follows:

$$V_s = g\gamma\{[1-a(1-|R_{ox}|^2) - |R_{ox}|^2 a^2]T_{com} + a^2|R_{ox}|^2 T_e + a(1-|R_{ox}|^2)T_x + T_a + \Delta T_B(1+a^2|R_{ox}|^2)\}$$

It should be noted that $T_{com}$ can assume the value $T_1$, just as long as switch 8 is placed in the immediate vicinity thanks to monolithic integration of the device.

As to the other load 12, brought to temperature $T_2$, it will be thermally insulated from the rest thanks to the heat sinks, which represent a technique well known to a man of the art.

A new unknown is then introduced: "a"; it is thus appropriate to determine a new complementary equation. This is possible with the switch as described above, and following additional step will be effected, for example:

switch placed on channel 2 and supplying the said source $T_B$ via control 5.

The following relation will thus be obtained:

$$V_{25} = g\gamma[(1-a^2)T_{com} + a^2 T_e + T_a + (1+a^2)\Delta T_B]$$

and by making: $T_{com} = T_1$, the relation becomes:

$$V_{25} = g\gamma[(1-a^2)T_1 + a^2 T_e + T_a + (1+a^2)\Delta T_B]$$

Nonetheless, a calculation identical with the preceding one will enable us to arrive at relations determining the different variables if we do not neglect the losses at switch level, and if we fix $T_{com} = T_1$ namely:

$$V_1 = g\gamma[(1-a)T_1 + aT_1 + T_a]$$

$$V_{15} = g\gamma[(1-a)T_1 + aT_1 + T_a + \Delta T_B]$$

$$V_2 = g\gamma[(1-a^2)T_1 + a^2 T_e + T_a]$$

$$V_3 = g\gamma\{[1-a(1-|R_o|^2) - a^2|R_o|^2]T_1 + a^2|R_o|^2 T_e + (1-|R_o|^2)aT_x + T_a\}$$

$$V_{35} = g\gamma\{[1-a(1-|R_o|^2) - a^2|R_o|^2]T_1 + a^2|R_o|^2 T_e + (1-|R_o|^2)aT_x + T_a + \Delta T_B(1+a^2|R_o|^2)\}$$

$$V_4 = g\gamma[(1-a)T_1 + aT_2 + T_a]$$

It seems obvious, of course, that one particular application would be that of temperature measurement in an industrial or medical environment or a home robotics application.

Apart from this field of application, another application of the measuring process according to the present invention should be emphasized: that of determining the microwave frequency reflection coefficient of a given material or object.

Through this expedient, it will then be possible to determine the dielectric or physical properties of a material, for example moisture content, structure, etc.

Other embodiments of the present invention, within the grasp of a man of the art, could, of course, be contemplated without thereby departing from the scope of the present invention.

We claim:

1. A process for measuring the temperature $T_x$ of a given material or object, using microwave frequency radiation, comprising the steps of:

receiving microwave radiation emitted via an antenna having a reflection coefficient $|R_{ox}|^2$;

routing the signals received to signal processing means, wherein the signal processing means inherently induce a correlation noise; and intercalating between the antenna and the signal processing means, to select an intercalary line to have a length L so as to render the correlation noise negligible with respect to the signal voltage; wherein the length L is selected to be very large in relation to the wavelength of the signals processed, such that the correlation factor of the signal processing means is negligible.

2. The process according to claim 1, wherein said routing step further comprises: routing via the length L of the intercalary line, to an input of the processing means with a power gain $\tau_g$, an input noise temperature $T_e$ and an output noise temperature $T_a$ such that there is obtained at an output of the signal processing means an output voltage:

$$V_s g\gamma[T_x(1-|R_{ox}|^2) + T_e|R_{ox}|^2 + T_a]$$

said process further comprising the step of calculating all the parameters periodically, by modifying cyclically the structure of the signal processing means.

3. The process according to claim 2, further comprising the step of selectively and cyclically subjecting the signal processing means to the influence of a high impedance source of noise $\Delta T_B$ and obtaining a voltage corresponding to:

$$V_s = g\gamma[T_x(1-|R_{ox}|^2) + T_e|R_{ox}|^2 + T_a + \Delta T_B(1+|R_{ox}|^2)]$$

at the output of the signal processing means.

4. The process according to claim 3, further comprising the steps of cyclically connecting the input of the signal processing means to:

(a) a load having known characteristics and a temperature $T_1$;

(b) the load having known characteristics and a temperature $T_1$ together with the high impedance source of noise $\Delta T_B$;

(c) ground via a line having a length L;

(d) the antenna via the intercalary line having a length L;

(e) the antenna via the intercalary line and the source of noise $\Delta T_B$; and (f) a load having known characteristics and a temperature $T_2$.

5. The process according to claim 4, further comprising the step of:

computing at least temperature $T_x$ at each cycle, by solving the following system of equations:

$$V_1 = \gamma g[T_1 + T_a]$$

$$V_{15} = \gamma g[T_1 + T_a] + \Delta T_B]$$

$$V_2 = \gamma g[T_e + T_a]$$

$$V_3 = \gamma g[(1 - |R_{o\,x}|^2)T_x + |R_{o\,x}|^2 T_e + T_a]$$

$$V_{35} = \gamma g[(1 - |R_{o\,x}|^2)T_x + |R_{o\,x}|^2 T_e + T_a + (1 + |R_{o\,x}|^2 \Delta T_B)]$$

$$V_4 + \gamma g[T_2 + T_a]$$

wherein $V_1$ is the voltage derived during cyclical connection step (a); $V_{15}$ is the voltage derived during cyclical connection step (b); $V_2$ is the voltage derived during cyclical connection step (c); $V_3$ is the voltage derived during cyclical connection step (d); $V_{35}$ is the voltage derived during cyclical connection step (e); and $V_4$ is the voltage derived during cyclical connection step (f).

6. The process according to claim 1, further comprising the step of determining a microwave frequency reflection coefficient of a given material or object.

7. A device for measuring the temperature $T_x$ of a given material or object, using microwave radiation, comprising:

an antenna for receiving signals;

means for processing the received signals; and a selectable intercalary electrical line having a length L, of a given impedance as a function of the input impedance of said processing means, electrically connecting said antenna and said processing means, wherein said length L of said intercalary electrical line is selected to be very large in relation to the wavelength of the signals processed so as render the correlation voltage negligible with respect to the signal voltage.

8. The device according to claim 7, wherein said processing means comprise a direct amplification microwave frequency receiver, followed by a square law detector and preceded by a microwave frequency multi-channel switch.

9. The device according to claim 7, further comprising a source of noise suitable for reinjecting complementary noise $\Delta T_B$ placed at an input of said processing means.

10. The device according to claim 9, further comprising:

a switch having at least four microwave frequency channels connected to:

(a) a load of known characteristics and a temperature $T_1$;

(b) a line having a length L connected to ground;

(c) said intercalary electrical line having a length L connected to said antenna;

(d) another load of known characteristics and a temperature $T_2$;

(e) said source of noise $\Delta T_B$, wherein said source of noise is activated and inactivated via a control.

11. The device according to claim 10, further comprising a computing and synchronizing unit which enables on one hand, said microwave frequency switch and said control to be operated cyclically and, on the other hand, real-time mathematical solving of a system of equations defined for each condition of said switch for determining at least the temperature $T_x$ of a body to be measured.

12. The device according to claim 10, wherein said load and said another load each have an impedance of 50 ohms and are placed at a predetermined, known temperature $T_1$, $T_2$.

13. The device according to claim 9, wherein said source of complementary noise comprises a MES FET element, reverse biased to avalanche condition.

14. The device according to claim 9, wherein said source of complementary noise comprises an avalanche diode placed in series with a resistor $R\rho$, having a large ohmic value in relation to the input impedance of said processing means, placed at an input of said processing means.

15. The device according to claim 8, wherein said receiver comprises an integrated monolithic amplifier, with a microwave frequency pass-band, a large gain g and a low noise factor.

16. The device according to claim 8, wherein said square law detector comprises a Schottky detector.

17. The device according to claim 8, wherein said switch comprises an assembly of four MES FET elements.

18. The device according to claim 7, wherein line L is chosen to have an impedance of 50 ohms and a length of at least 10 cm for a frequency pass-band of 2 to 4 GHz.

19. A process for measuring the temperature $T_x$ of a given material or object, using microwave frequency radiation, comprising the steps of:

receiving microwave radiation emitted via an antenna having a reflection coefficient $|R_{o\,x}|^2$;

routing the signals received to signal processing means; and intercalating between the antenna and the signal processing means a line having a length L that is very large in relation to the wavelength of the signals processed, such that the correlation factor of the signal processing means is negligible;

wherein said routing step further comprises routing via the length L of the intercalary line to an input of the processing means with a power gain $\tau_g$, an input noise temperature $T_e$ and an output noise temperature $T_a$, to obtain an output voltage at an output of the signal processing means, wherein the output voltage is characterized by the following equation:

$$V_s = g\,\gamma[T_x(1 - |R_{o\,x}|^2) + T_e|R_{o\,x}|^2 + T_a$$

said process further comprising the step of calculating all the parameters periodically, by modifying cyclically the structure of the signal processing means.

20. A device for measuring the temperature $T_x$ of a given material or object, using microwave radiation, comprising:

an antenna for receiving signals;

means for processing the received signals, comprising a direct amplification microwave frequency receiver, followed by a square law detector and preceded by a microwave frequency multi-channel switch; and a selectable intercalary electrical line having a length L, of a given impedance as a function of the input impedance of said processing means electrically connecting said antenna and said processing means wherein said length L of said intercalary electrical line is selected to be very large in relation to the wavelength of the signals processed so as render the correlation voltage negligible with respect to the signal voltage.

* * * * *